United States Patent
Ho

(10) Patent No.: US 11,127,473 B1
(45) Date of Patent: Sep. 21, 2021

(54) MEMORY APPARATUS AND DATA READING METHOD THEREOF

(71) Applicant: Winbond Electronics Corp., Taichung (TW)

(72) Inventor: Wen-Chiao Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/847,676

(22) Filed: Apr. 14, 2020

(51) Int. Cl.
*G11C 16/26* (2006.01)
*G06F 11/10* (2006.01)

(52) U.S. Cl.
CPC .......... *G11C 16/26* (2013.01); *G06F 11/1068* (2013.01)

(58) Field of Classification Search
CPC ..................... G06F 11/1068; G11C 16/26
See application file for complete search history.

(56) References Cited

U.S. PATENT DOCUMENTS

| 2008/0285340 | A1* | 11/2008 | Song | G11C 11/5642 365/185.2 |
| 2015/0310921 | A1* | 10/2015 | Melik-Martirosian | G11C 16/10 365/185.19 |
| 2016/0093396 | A1* | 3/2016 | Alhussien | G11C 29/026 365/185.21 |
| 2017/0271031 | A1* | 9/2017 | Sharon | G06F 11/3058 |
| 2019/0114227 | A1* | 4/2019 | Lin | G06F 11/1068 |

* cited by examiner

Primary Examiner — Guy J Lamarre
(74) Attorney, Agent, or Firm — JCIPRNET

(57) ABSTRACT

A memory apparatus and a data reading method thereof are provided. In the method, a plurality of memory cells of the memory apparatus are read to obtain read data, in which a threshold voltage of each memory cell is sensed and respectively compared with a first reference voltage and a second reference voltage to determine bit values. The first reference voltage and the second reference voltage are used to distinguish different states of the memory cell and the second reference voltage is larger than the first reference voltage. The bit values of the memory cells having the threshold voltage between the first reference voltage and the second reference voltage in the read data are gradually changed and syndromes of the changed read data are calculated. The read data is corrected according to values of the syndromes.

8 Claims, 10 Drawing Sheets

Read a plurality of memory cells in a memory to obtain read data, including sensing a threshold voltage of each memory cell, and comparing the sensed threshold voltage respectively with a first reference voltage and a second reference voltage to determine bit values — S410

Gradually change the bit values of the memory cells having the threshold voltage between the first reference voltage and the second reference voltage in the read data to calculate syndromes of the changed read data — S420

Correct the read data according to values of the syndromes — S430

|  | Read data | | | | | | | | Parity bits | | | | Syndromes | | | |
| --- | --- | --- | --- | --- | --- | --- | --- | --- | --- | --- | --- | --- | --- | --- | --- | --- |
| | D[7] | D[6] | D[5] | D[4] | D[3] | D[2] | D[1] | D[0] | P[3] | P[2] | P[1] | P[0] | S[3] | S[2] | S[1] | S[0] |
| | 1 | 1 | 0 | 0 | 0 | 1 | 0 | 1 | 0 | 0 | 0 | 1 | 0 | 0 | 1 | 1 |
| | 1 | 1 | 0 | 0 | 0 | 1 | 0 | 1 | 0 | 1 | 0 | 1 | 0 | 1 | 1 | 1 |
| | 1 | 1 | 0 | 0 | 1 | 1 | 0 | 1 | 0 | 0 | 0 | 1 | 0 | 1 | 0 | 0 |
| | 1 | 1 | 0 | 0 | 1 | 1 | 0 | 1 | 0 | 1 | 0 | 1 | 0 | 0 | 0 | 0 |

Correction

FIG. 7B

MEMORY APPARATUS AND DATA READING METHOD THEREOF

BACKGROUND OF THE INVENTION

1. Field of the Invention

The invention relates to a memory apparatus and an operating method thereof, and in particular, to a memory apparatus and a data reading method thereof.

2. Description of Related Art

Because memory apparatuses such as a flash memory and a Dynamic Random Access Memory (DRAM) are becoming more integrated year on year, component sizes are decreasing continuously, resulting in a higher bit error rate of a memory cell. Conventionally, a redundant memory may be used to remedy a memory cell having defects, or an error checking correction (ECC) circuit may be used to correct soft errors caused by the defects.

FIG. 1A and FIG. 1B show the distribution of threshold voltages of a conventional flash memory, where the horizontal axis represents a threshold voltage Vt of memory cells, and the vertical axis represents the number of bits #. Referring to FIG. 1A, region A shows a memory cell of a high threshold voltage (having a bit value of 0); region B shows a memory cell of a low threshold voltage (having a bit value of 1); a reference voltage Ref is between region A and region B, and is used to be compared with the detected threshold voltages of the memory cells to distinguish whether read data is 0 or 1; a "0" reading window represents an interval between the reference voltage Ref and an edge of the memory cell having the bit value of 0; a "1" reading window represents an interval between the reference voltage Ref and an edge of the memory cell having the bit value of 1. A read operation of the memory cells is to sense a current of the target memory cell and compare the current with a reference current. If the current of the memory cell is less than the reference current, the read data is determined as 0; on the contrary, if the current of the memory cell is larger than the reference current, the read data is determined as 1.

However, based on a reliability factor, after the memory apparatus is read or written for thousands or tens of thousands of times, a phenomenon of threshold voltage shift may occur on many memory cells. Referring to FIG. 1B, when the threshold voltage of the selected memory cell is located at the edge of region A of the high threshold voltage, based on the reliability factor, the threshold voltage may further decrease to trigger two cases: case a, the reading window is narrowed, and in this case, a read error may be caused because of an insufficient sensing margin; case b, the threshold voltage falls directly into the region in which the bit value of the memory cell is 1, resulting in a read error.

FIG. 2A to FIG. 2C show an example of correcting errors by using a conventional ECC circuit. In this example, hamming codes are used as an example to describe how the hamming codes are used to correct errors in read data. Specifically, in the conventional ECC technology, parity bits are generated by a write end (or a transmit end) based on the original data by using a preset algorithm, and are added to original data for transmission. Therefore, when a read end (or a receive end) reads data, consistency between the original data and the parity bits may be checked to judge whether read errors occur and correct the error data.

Referring to FIG. 2A, it is assumed that the original data has eight bits (including data bits D[0] to D[7]), and according to rules of the hamming codes, four bits P[0] to P[3] are parity bits. A right side of FIG. 2A shows a calculation manner of the parity bits P[0] to P[3], where a symbol "⊕" represents an exclusive-OR (XOR) operation. During data write, the parity bits P[0] to P[3] are written into a memory together with the data bits D[0] to D[7] of the original data.

Referring to FIG. 2B, in a read operation, read data may be obtained with the sensing manner of FIG. 1A, including the data bits and the parity bits. Based on the data bits, new parity bits p'[0] to p'[3] may be recalculated. By performing an XOR operation on the new parity bits p'[0] to p'[3] and the parity bits P[0] to P[3] in the read data respectively, syndromes S[0] to S[3] may be obtained. It may be known from FIG. 2B that, if no error occurs in the read data, values of the calculated syndromes S[0] to S[3] are all zero. However, if single bit errors occur in the read data (for example the shaded bits in the second to thirteenth rows), the values of the calculated syndromes S[0] to S[3] are not all zero, and combinations of the syndromes do not repeat. Therefore, the read end may learn the bit with an error in the read data according to the values of the syndromes S[0] to S[3], and correct the bit (reverse the value of the bit).

However, if a double bit error occurs in the read data (for example in the last row in FIG. 2C, errors occur in the data bits D[7] and D[6]), the syndromes [0, 1, 1, 1] obtained after calculation are the same as the syndromes obtained when an error occurs in the data bit D[3]. In this case, if the data bit D[3] is corrected based on the ECC rule, an error of read data is caused. Therefore, it may be known that the ECC algorithm using the hamming codes can correct one bit but can sense two bits, so a correction scope thereof is limited.

SUMMARY OF THE INVENTION

A memory apparatus and a reading method thereof are provided in the invention, which can improve a correction limitation of the ECC algorithm.

The invention provides a data reading method, suitable for reading data of a memory, including: reading a plurality of memory cells in the memory to obtain read data, in which a threshold voltage of each memory cell is sensed, and the sensed threshold voltage is respectively compared with a first reference voltage and a second reference voltage to determine bit values, where the first reference voltage and the second reference voltage are used to distinguish different states of the memory cell and the second reference voltage is larger than the first reference voltage; gradually changing bit values of the memory cells having the threshold voltage between the first reference voltage and the second reference voltage in the read data to calculate syndromes of the changed read data; and correcting the read data according to values of the syndromes.

The invention provides a memory apparatus, including a memory and a processor. The memory includes a plurality of memory cells. The processor is coupled to the memory cells in the memory, and is configured to read the memory cells to obtain read data, including sensing a threshold voltage of each memory cell, and comparing the sensed threshold voltage respectively with a first reference voltage and a second reference voltage to determine bit values, where the first reference voltage and the second reference voltage are used to distinguish different states of the memory cell and the second reference voltage is larger than the first reference voltage. Then, the processor is configured to gradually change bit values of the memory cells having the threshold voltage between the first reference voltage and the second reference voltage in the read data to calculate syndromes of the changed read data, and correct the read data according to values of the syndromes.

Based on the foregoing, in the memory apparatus and the data reading method thereof of the invention, memory cells in which errors may occur are found out by using a dual sensing technology, and reverse error checking correction may be performed on memory cells to find out the memory cells in which errors occur and correct bit values, and the correct bit values are used to correct the read data. Therefore, the correction limitation of the ECC algorithm can be improved.

BRIEF DESCRIPTION OF THE DRAWINGS

FIG. 2A to FIG. 2C show examples of correcting errors by using a conventional error checking correction circuit.

FIG. 7A and FIG. 7B show examples of a reverse error checking correction algorithm according to an embodiment of the invention.

DESCRIPTION OF THE EMBODIMENTS

In the conventional ECC algorithm, each bit in read data is treated equally (that is, each bit is regarded as a possible error bit). However, in embodiments of the invention, it is presumed that not all bits have the same possibility of error to internal features of a memory, that is, memory cells having relatively weak features are more likely to cross reference voltages and have state changes in a cycle operation. Accordingly, embodiments of the invention correct corresponding bits of such memory cells. In addition, in the conventional ECC algorithm, a single reference voltage is set to distinguish different states of the memory cells. However, in the embodiments of the invention, two reference voltages are set to distinguish states of the memory cells, and in a sensing process, bits in the read data having sensed threshold voltages between the two reference voltages are set to suspected bits, and a plurality of logical combinations are used to change bit values of the suspected bits gradually to calculate syndromes of changed read data. Therefore, the read data may be corrected according to values of the calculated syndromes, so that the correction limitation of the ECC algorithm is improved.

Figure 3:
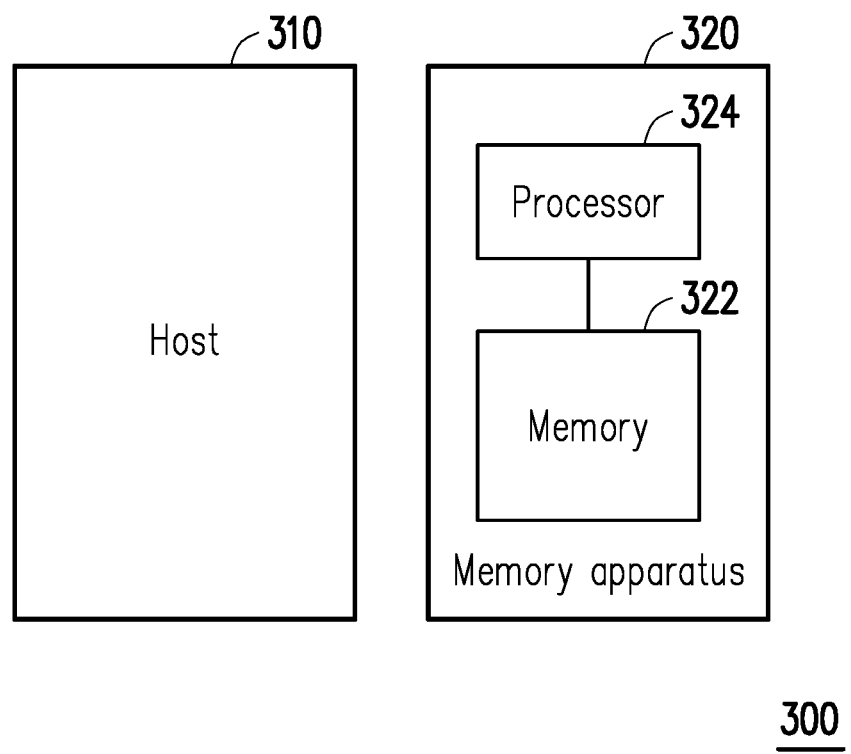
FIG. 3 is a schematic diagram of a system including a memory apparatus according to an embodiment of the invention.

FIG. 3 is a schematic diagram of a system including a memory apparatus according to an embodiment of the invention. Referring to FIG. 3, a system 300 of this embodiment includes a host 310 and a memory apparatus 320 connected to the host 310. The host 310 is an electronic device, for example, a computer, a mobile phone, and a digital camera or the like, or is a chip mounted on a chipset, which is not particularly limited. The memory apparatus 320 includes a memory 322 and a processor 324.

For example, the memory 322 is composed of a plurality of memory cells arranged in a matrix shape, where the memory cell is a non-volatile memory component such as a NOR or NAND flash memory and an Electrically Erasable Programmable Read-Only Memory (EEPROM) or the like, or a volatile memory component such as a Dynamic Random Access Memory (DRAM) or a Static Random Access Memory (SRAM), which is not limited herein.

For example, the processor 324 is a host interface configured to implement data transmission with the host 310, a memory interface configured to implement data transmission with the memory 322, a Micro-Processing Unit (MPU) configured to control the data transmission, and a Read Only Memory (ROM) or a random access memory (RAM) configured to store operation programs or data, which is not limited herein. For example, the processor 324 controls an overall operation of the memory apparatus 320, including a programming operation, a read operation and an erase operation or the like on the memory cells in the memory 322, which is not limited herein.

Figure 4:
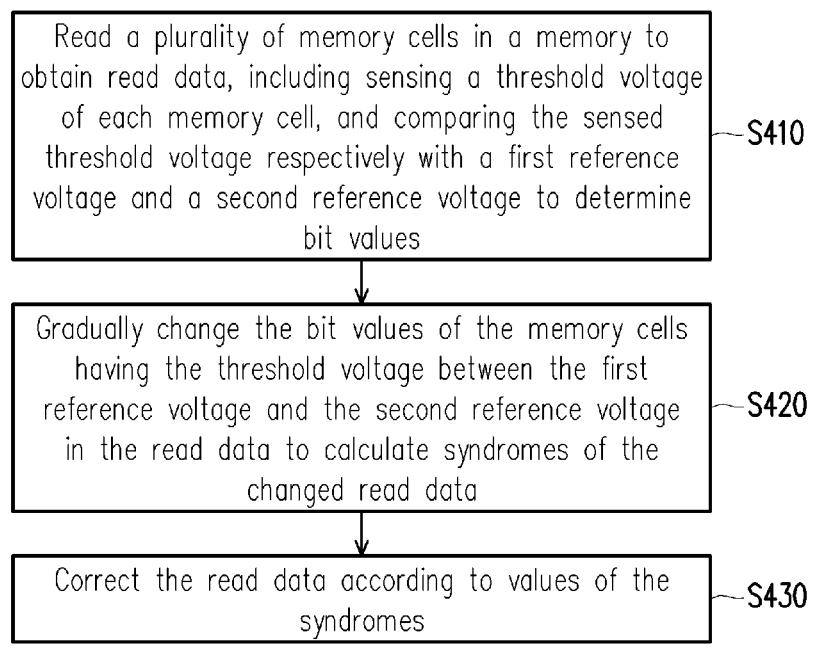
FIG. 4 is a flowchart of a data reading method of a memory apparatus according to an embodiment of the invention.

FIG. 4 is a flowchart of a data reading method of a memory apparatus according to an embodiment of the invention. Referring to FIG. 3 and FIG. 4 at the same time, an operation method of this embodiment is suitable for the memory apparatus 320 of FIG. 3, and each step of the data reading method of this embodiment of the invention is described in the following together with each component in the memory apparatus 320.

In step S410, the processor 324 reads a plurality of memory cells in the memory 322 to obtain read data, including sensing a threshold voltage of each memory cell, and comparing the sensed threshold voltage respectively with a first reference voltage and a second reference voltage to determine bit values. The first reference voltage and the second reference voltage are used to distinguish different states of the memory cell and the second reference voltage is larger than the first reference voltage.

In an embodiment, the first reference voltage and the second reference voltage are determined according to distribution of the threshold voltages of the memory cells of the memory 322. For example, the first reference voltage and the second reference voltage are voltages obtained by respectively adding a preset value (or a preset ratio) to or subtracting a preset value (or a preset ratio) from an original reference voltage used to distinguish different states of the memory cells, where the first reference voltage is less than the original reference voltage and greater than a maximum voltage value of in a low threshold voltage region, and the second reference voltage is larger than the original reference voltage and less than a minimum voltage value in a high threshold voltage region. In other embodiments, the first reference voltage and the second reference voltage may also be two voltage values selected between the maximum voltage value in the low threshold voltage region and the minimum voltage value in the high threshold voltage region according to the distribution of the threshold voltages of the memory cells of the memory 322, which is not limited herein.

Figure 5:
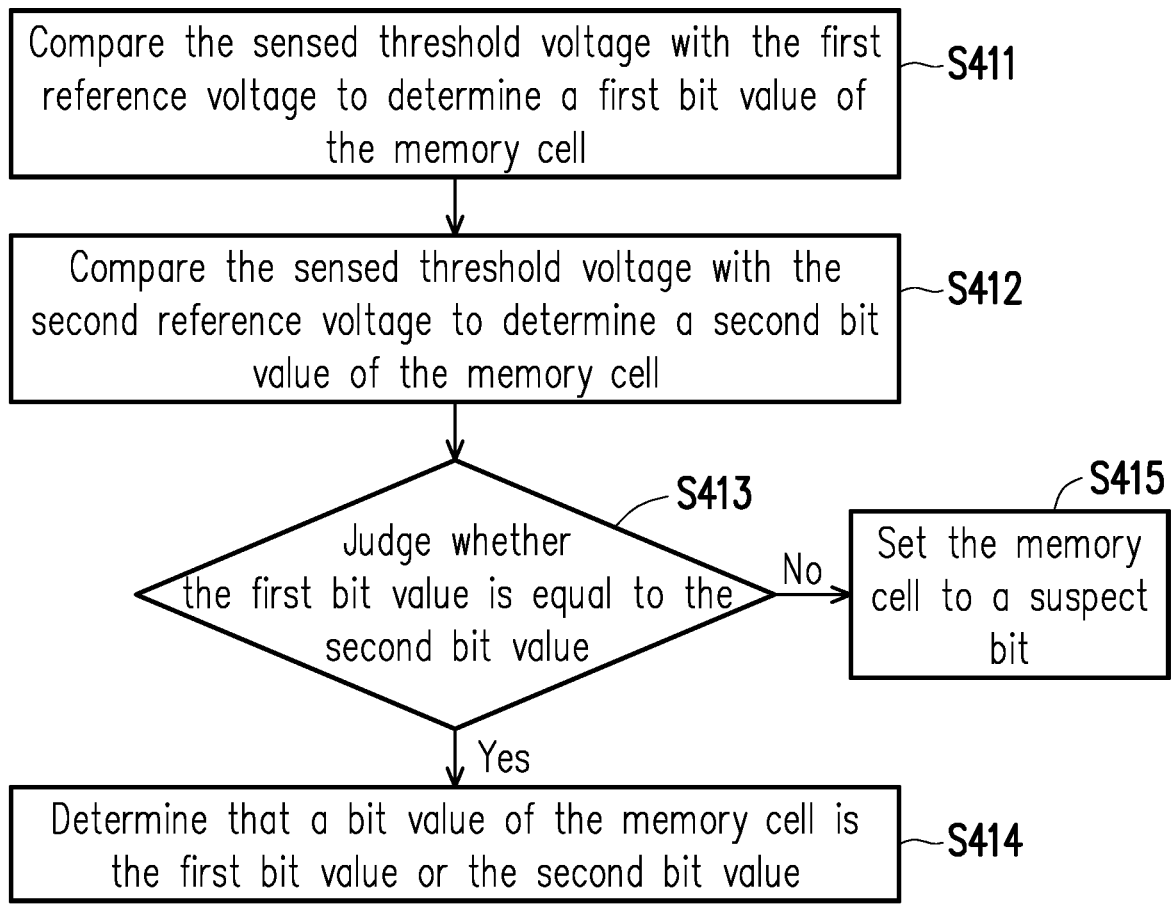
FIG. 5 is a flowchart of a dual sensing method of a memory apparatus according to an embodiment of the invention.

FIG. 5 is a flowchart of a dual sensing method of a memory apparatus according to an embodiment of the invention. Referring to FIG. 5, the detailed process of step S410 in FIG. 4 is described in this embodiment.

In step S411, the processor 324 compares the sensed threshold voltage with the first reference voltage to determine a first bit value of the memory cell.

In step S412, the processor 324 compares the sensed threshold voltage with the second reference voltage to determine a second bit value of the memory cell.

In step S413, the processor 324 judges whether the first bit value of each memory cell is equal to the second bit value of the memory cell. If the first bit value is equal to the second bit value, in step S414, the processor 324 determines that a bit value of the memory cell is the first bit value or the second bit value; on the contrary, if the first bit value is not equal to the second bit value, in step S415, the processor 324 sets the memory cell to a suspected bit.

The suspected bits are the foregoing bits corresponding to the memory cells likely to cross reference voltages and have state changes in a cycle operation. By correcting the bits corresponding to the memory cells, the correction limitation of the ECC algorithm can be improved.

Figure 1A:
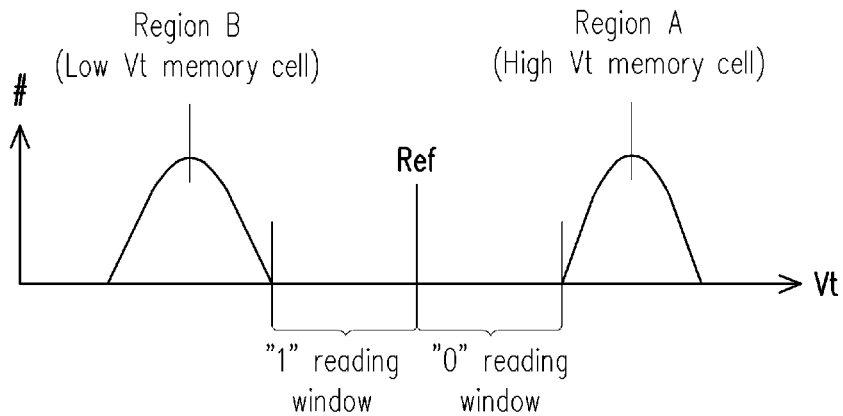
FIG. 1A and FIG. 1B show distribution of threshold voltages of a conventional flash memory.
Figure 1B:
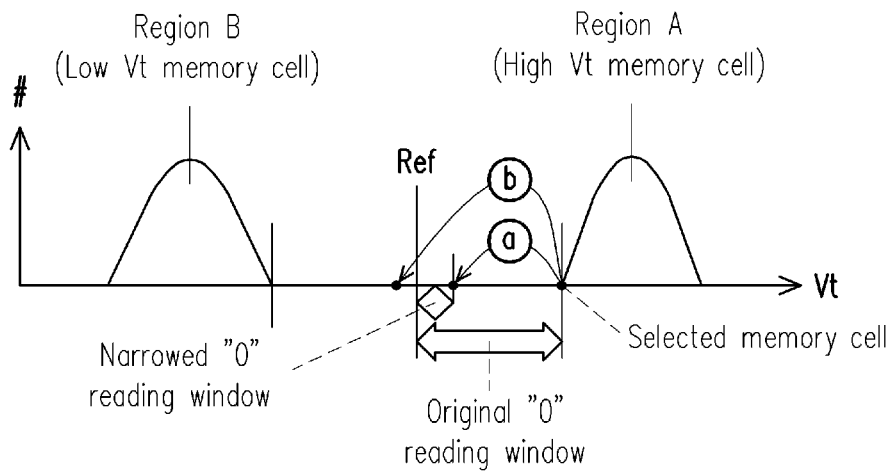
Figure 6:
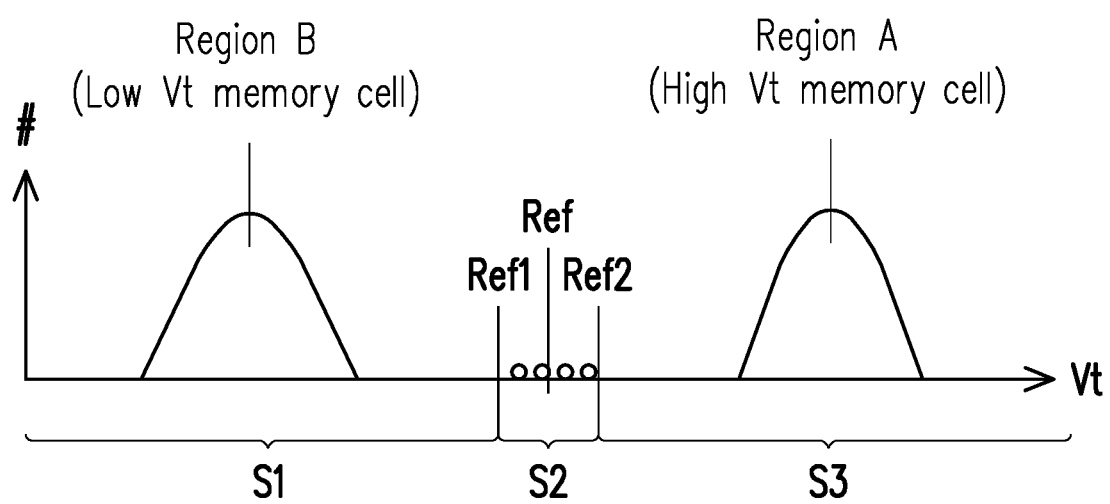
FIG. 6 is a schematic diagram of a dual sensing method of a memory apparatus according to an embodiment of the invention.

FIG. 6 is a schematic diagram of a dual sensing method of a memory apparatus according to an embodiment of the invention. Referring to FIG. 6, distribution of threshold voltages of a flash memory is shown in this embodiment, where the horizontal axis represents a threshold voltage Vt of memory cells, and the vertical axis represents the number of bits #. Region A shows memory cells of a high threshold voltage (having a bit value of 0), and region B shows memory cells of a low threshold voltage (having a bit value of 1). Different from the conventional sensing technology, two reference voltages Ref1 and Ref2 are set between region A and region B in this embodiment, and a relationship between the reference voltages Ref1 and Ref2 and an original reference voltage Ref (as shown in FIG. 1A) is: Ref2>Ref>Ref1, and the definition of values and the setting manner thereof are described in detail in the foregoing embodiments, and thus the descriptions thereof are omitted herein.

Each memory cell in a memory is sensed respectively by using the reference voltages Ref1 and Ref2, and when a sensed result is larger than the reference voltages, a bit value is set to 0; when a sensed result is less than the reference voltages, the bit value is set to be 1. Accordingly, three results can be obtained: region S1, bit values of the dual sensing result is (1, 1); region S2, bit values of the dual sensing result is (0, 1); region S3, bit values of the dual sensing result is (0, 0).

If the bit values of the dual sensing result is (1, 1), the bit value of the memory cell may be determined as 1; if the bit values of the dual sensing result is (0, 0), the bit value of the memory cell may be determined as 0; and if the bit values of the dual sensing result is (0, 1), the bit value of the memory cell may fall into a dangerous region in which errors may occur, and the memory cell is regarded as the foregoing suspected bit.

Referring back to the process of FIG. 4, in step S420, the processor 324 gradually changes bit values of memory cells (that is, the suspected bits) having a threshold voltage between the first reference voltage and the second reference voltage in read data to calculate syndromes of the changed read data. For example, if there is only one suspected bit in the read data, the bit values of the suspected bit may be changed into logical values 0 and 1 to calculate the syndromes of the changed read data; and if there are two suspected bits in the read data, the bit values of the two suspected bits are changed into logical combinations of (0, 0), (0, 1), (1, 0) and (1, 1) gradually to calculate the syndromes of the changed read data. Similarly, with the increase of the number of suspected bits, the processor 324 may change bit values of the suspected bits gradually into one of a plurality of logical combinations to calculate syndromes of the changed read data after each change.

Furthermore, the processor 324 calculates new parity bits by using data bits in the changed read data, and compares the new parity bits with parity bits in the changed read data to calculate syndromes of the changed read data. Using the Error Checking Correction (ECC) algorithm that uses hamming codes as an example, for each read data having twelve bits, for example, the processor 324 selects the first eight bits in the changed read data as data bits to calculate new parity bits, and performs an XOR operation on the last four bits (that is, original parity bits) of the changed read data to obtain four syndromes. It should be noted that in other embodiments, the processor 324 may also use ECC algorithms of other types, for example Bose-Chaudhuri-Hocquenghem codes (BCH codes) and Reed-Solomon codes (RS codes) or the like, which is not limited herein.

Lastly, in step S430, the processor 324 corrects the read data according to values of the syndromes. Specifically, in the conventional ECC algorithm, a position of an error bit is determined through calculation with syndromes. However, in this embodiment, a reverse manner (or referred to as a reverse ECC algorithm), a try and error method is used to firstly guess values of the error bit, which are then imported into the ECC algorithm for verification. Therefore, not only the position of the error bit may be determined, but also correct bit values may be determined. That is, this embodiment guesses the bit values of the memory cells gradually for the foregoing memory cells (that is, the suspected bits) in which errors may occur, and the bit values are imported into the ECC algorithm for calculation; if values of the calculated syndromes are not all 0, it indicates that the guessed bit values have errors. In this case, the bit values may be changed again, and the calculation of the ECC algorithm is performed again, until the values of the calculated syndromes are all 0, and at this time, the guessed bit values may be presumed to be correct. In this case, the guessed bit values may be used to replace corresponding bits in the read data, and the correction of the read data is accomplished.

Figure 7A:
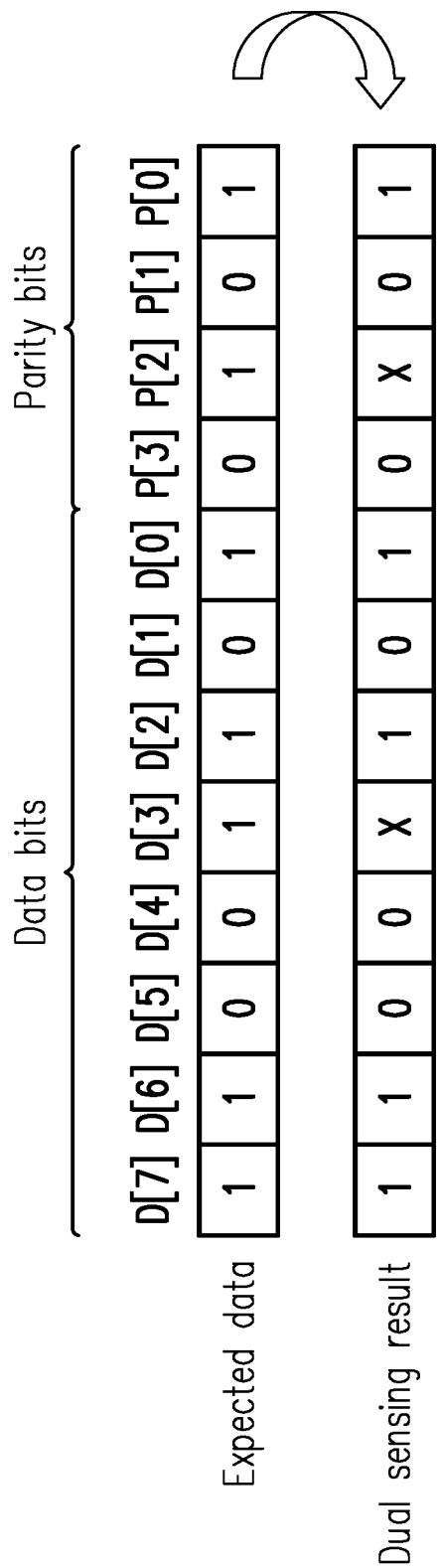

For example, FIG. 7A and FIG. 7B are examples of a reverse error checking correction algorithm according to an embodiment of the invention. Referring to FIG. 7A, bit values in a first row represent expected data, and bit values in a second row represent results of a dual sensing on read data. In FIG. 7A, it is assumed that sensing results of a data bit D[3] and a parity bit P[2] in the read data fall into a dangerous region in which errors may occur. That is, sensing results of data bits D[7]/[6]/[2]/[0] and a parity bit P[0] are (1, 1), and the bit value thereof may be determined as 1; sensing results of data bits D[5]/[4]/[1] and a parity bit P[3]/[1] are (0, 0), and the bit value thereof may be determined as 0; sensing results of the data bit D[3] and the parity bit P[2] are (0, 1), and the two bits may be regarded as suspected bits.

Four possible logical combinations of the suspected bits D[3] and P[2] in FIG. 7A are used in FIG. 7B: (D[3], P[2])=(0, 0), (0, 1), (1, 0), (1, 1). The bit values of the suspected bits D[3] and P[2] are changed gradually, and the ECC algorithm is used to calculate syndromes S[3] to S[0] of the changed read data. It may be known from the values of the calculated syndromes S[3] to S[0] that when the values are all zero, the changed read data is correct data, and correct bit values of the suspected bits D[3] and P[2] are (1, 1).

Figure 2A:
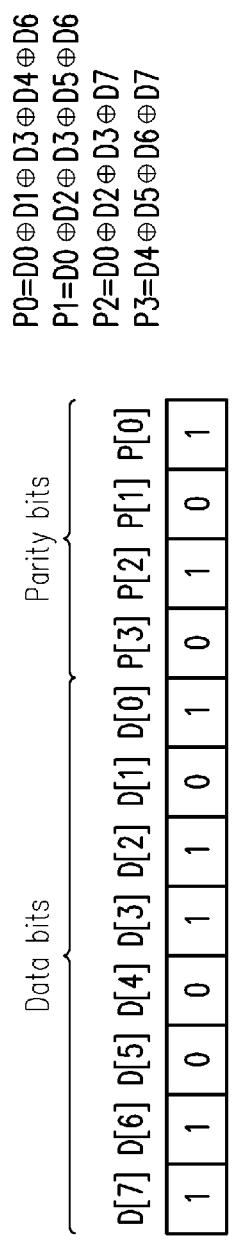
Figure 2B:
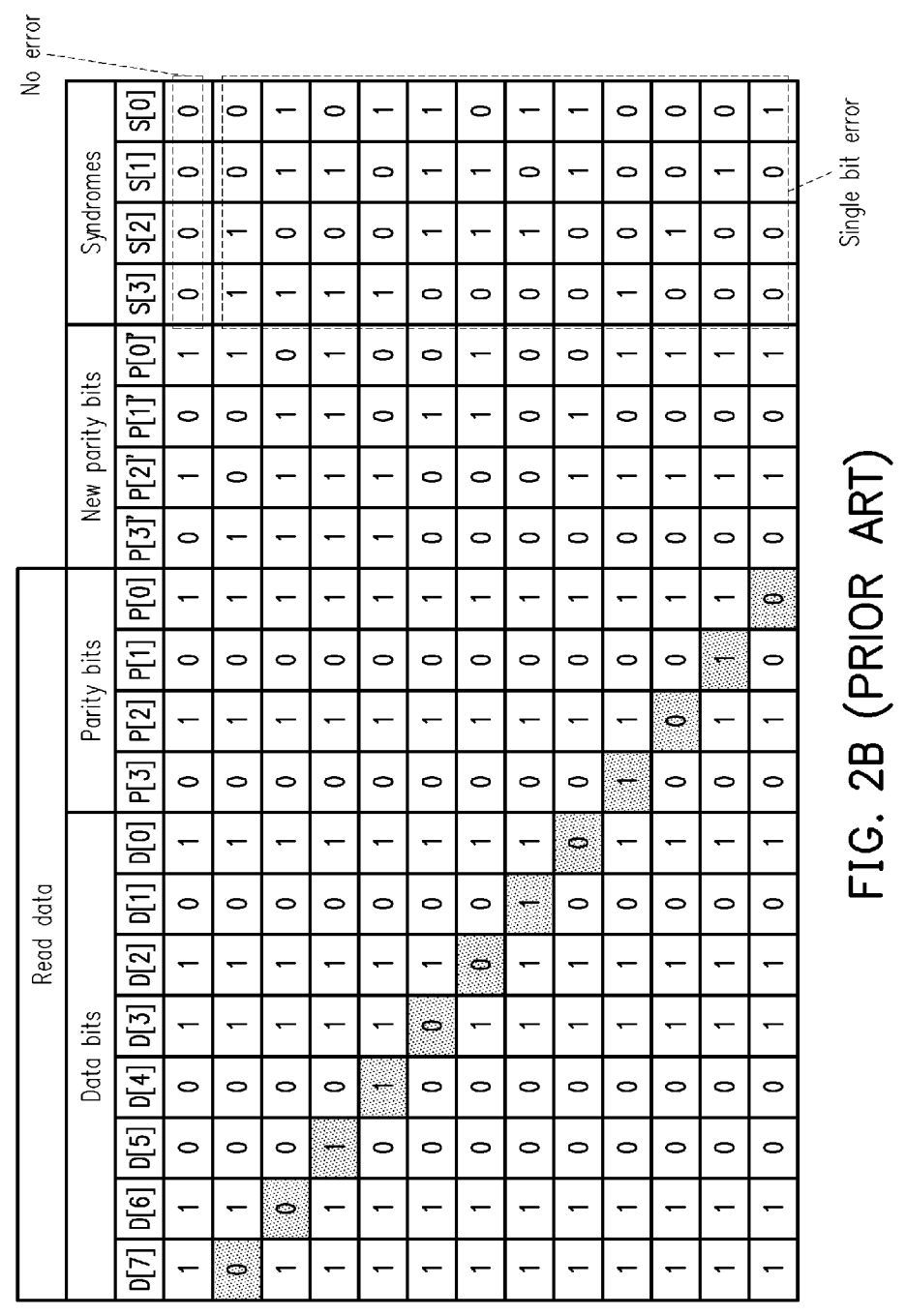
Figure 2C:
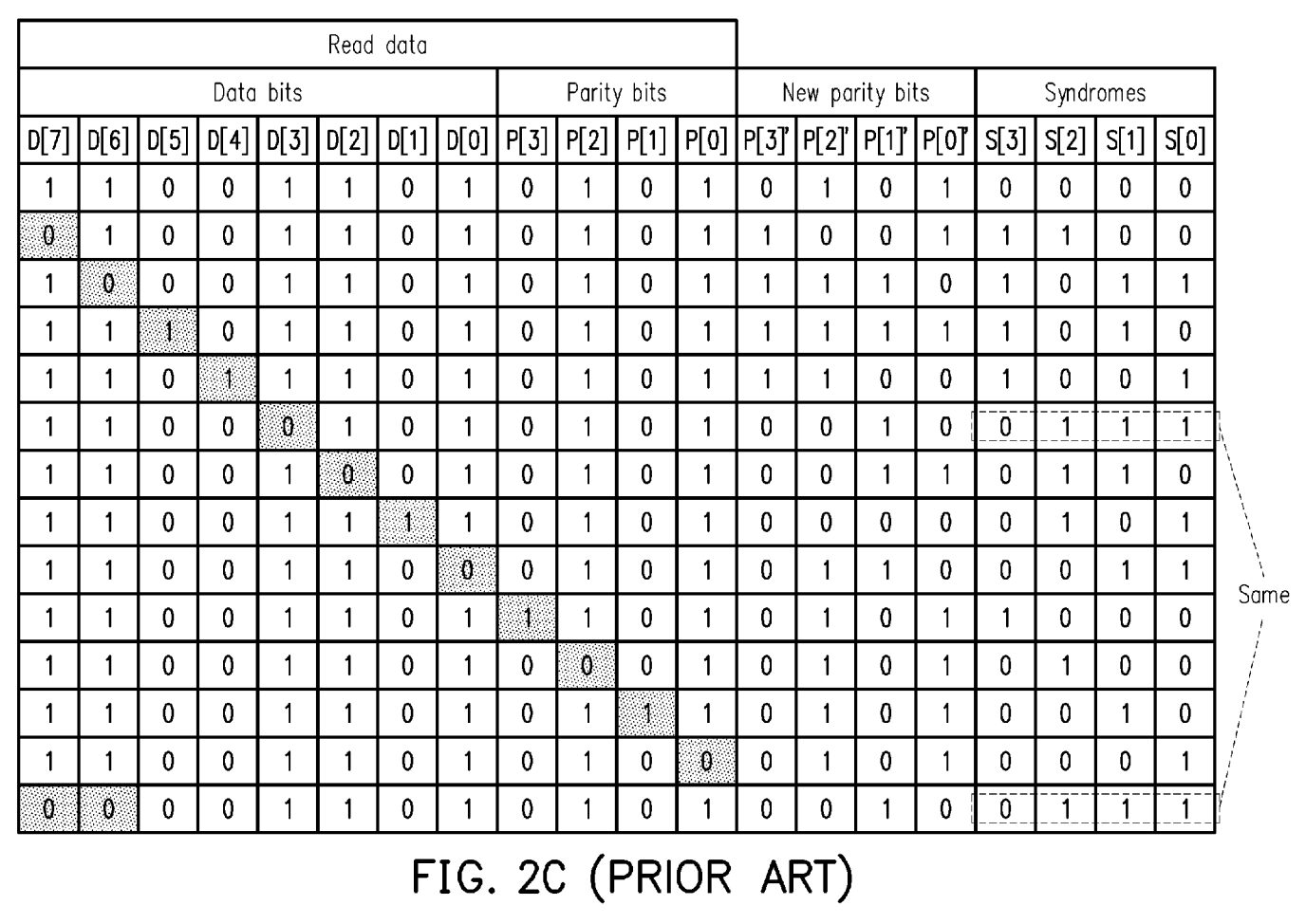

It may be known from comparison between FIG. 7B using the method of this embodiment and FIG. 2C using the conventional method (using the hamming codes as an example), the conventional ECC algorithm can only correct single bit errors, but if the dual sensing method of this embodiment is used, the correction can be achieved regardless of the number of error bits being 1 or 2. In other words, the method of this embodiment can increase the number of correction bits of the ECC algorithm to two bits.

Based on the foregoing, in the memory apparatus and the data reading method thereof of the invention, by setting two reference voltages to distinguish states of memory cells, bits in which errors may occur can be found out, and by gradually changing bit values of the bits and verifying with the ECC algorithm, positions of the error bits and the bit values can be determined. Therefore, regardless of the hamming codes, the BCH codes or the RS codes used by the ECC algorithm, the method of the invention can increase the number of correction bits of the algorithm.

The invention is disclosed by the embodiments above, but the invention is not limited by the embodiments. Various modifications and variations can be made by persons skilled in the art without departing from the scope or spirit of the invention. Therefore, the protection scope of the invention shall be subject to the appended claims.

What is claimed is:

1. A data reading method, suitable for reading data of a memory, comprising:
   reading a plurality of memory cells in the memory to obtain bit values of read data, wherein a threshold voltage of each of the memory cells is sensed and the sensed threshold voltage is respectively compared with a first reference voltage and a second reference voltage to determine the bit values, wherein the first reference voltage and the second reference voltage are used to distinguish different states of the memory cell and the second reference voltage is larger than the first reference voltage;
   determining a suspect bit value, among the bit values of the read data, that is obtained from a memory cell having the threshold voltage between the first reference voltage and the second reference voltage;
   gradually changing the suspect bit value in the bit values of the read data to generate changed read data;
   calculating syndromes of the changed read data; and
   correcting the read data according to values of the syndromes, wherein correcting the read data according to values of the syndromes comprises:
      judging whether the values of the calculated syndromes are all zero; and
      correcting the read data by using corresponding bit values of the changed memory cells in the changed read data when the values of the syndromes are all zero.

2. The method according to claim 1, wherein the step of respectively comparing the sensed threshold voltage with a first reference voltage and a second reference voltage to determine bit values comprises:
   comparing the sensed threshold voltage with the first reference voltage to determine a first bit value of the memory cell;
   comparing the sensed threshold voltage with the second reference voltage to determine a second bit value of the memory cell;
   confirming whether the bit value of the memory cell is the first bit value or the second bit value if the first bit value is equal to the second bit value; and
   setting the memory cell as a suspected bit if the first bit value is not equal to the second bit value.

3. The method according to claim 2, wherein the step of gradually changing bit values of the memory cells having the threshold voltage between the first reference voltage and the second reference voltage in the read data to calculate syndromes of the changed read data comprises:
   gradually changing a bit value of the suspected bit in the read data into one of a plurality of logical combinations to calculate syndromes of the changed read data after each change.

4. The method according to claim 1, wherein the step of calculating syndromes of the changed read data comprises:
   calculating new parity bits by using data bits in the changed read data and comparing the new parity bits with parity bits in the changed read data to calculate syndromes of the changed read data.

5. A memory apparatus, comprising:
   a memory, comprising a plurality of memory cells; and
   a processor, coupled to the memory cells in the memory, configured to:
      read the memory cells to obtain bit values of read data, which comprises sensing a threshold voltage of each of the memory cells and respectively comparing the threshold voltage with a first reference voltage and a second reference voltage to determine the bit values, wherein the first reference voltage and the second reference voltage are used to distinguish different states of the memory cell and the second reference voltage is larger than the first reference voltage;
      determine a suspect bit value, among the bit values of the read data, that is obtained from a memory cell having the threshold voltage between the first reference voltage and the second reference voltage;
      gradually change suspect bit value in the bit values of the read data to generate changed read data;
      calculate syndromes of the changed read data; and
      correct the read data according to values of the syndromes,
   wherein the processor is configured to judge whether the values of the calculated syndromes are all zero and correct the read data by using the corresponding bit values of the changed memory cells in the changed read data when the values of the calculated syndromes are all zero.

6. The memory apparatus according to claim 5, wherein the processor is configured to:
   compare the sensed threshold voltage with the first reference voltage to determine a first bit value of the memory cell;
   compare the sensed threshold voltage with the second reference voltage to determine a second bit value of the memory cell;
   confirm whether the bit value of the memory cell is the first bit value or the second bit value if the first bit value is equal to the second bit value; and
   set the memory cell as a suspected bit if the first bit value is not equal to the second bit value.

7. The memory apparatus according to claim 6, wherein the processor is configured to gradually change a bit value of the suspected bit in the read data into one of a plurality of logical combinations to calculate the syndromes of the changed read data after each change.

8. The memory apparatus according to claim 5, wherein the processor is configured to calculate new parity bits by using data bits in the changed read data, wherein the new parity bits are compared with parity bits in the changed read data to calculate the syndromes of the changed read data.

* * * * *